United States Patent
Fujimoto

(10) Patent No.: US 8,035,150 B2
(45) Date of Patent: Oct. 11, 2011

(54) NONVOLATILE SEMICONDUCTOR MEMORY DEVICE AND METHOD FOR MANUFACTURING THE SAME

(75) Inventor: Hiromasa Fujimoto, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 671 days.

(21) Appl. No.: 11/563,417

(22) Filed: Nov. 27, 2006

(65) Prior Publication Data

US 2007/0131979 A1   Jun. 14, 2007

(30) Foreign Application Priority Data

Nov. 28, 2005   (JP) ................................. 2005-342289

(51) Int. Cl.
*H01L 29/768* (2006.01)
*H01L 29/788* (2006.01)

(52) U.S. Cl. ........ 257/315; 257/244; 257/314; 257/261; 257/E21.209; 257/E29.129; 257/E29.3

(58) Field of Classification Search .................. 257/315, 257/244, 314, 261, E21.209, E29.129, E29.3
See application file for complete search history.

(56) References Cited

U.S. PATENT DOCUMENTS

| | | | |
|---|---|---|---|
| 5,808,319 A * | 9/1998 | Gardner et al. ................. | 257/67 |
| 6,703,661 B2 | 3/2004 | Wu | |
| 6,716,703 B2 * | 4/2004 | Hashimoto .................... | 438/264 |
| 7,064,375 B2 * | 6/2006 | Yonehama et al. ............. | 257/314 |
| 2002/0171112 A1 * | 11/2002 | Shimizu et al. ................ | 257/390 |
| 2004/0079985 A1 * | 4/2004 | Yonehama et al. ............. | 257/315 |
| 2006/0001092 A1 * | 1/2006 | Kim .............................. | 257/347 |
| 2006/0091447 A1 | 5/2006 | Ema | |
| 2006/0170064 A1 | 8/2006 | Yonehama et al. | |

FOREIGN PATENT DOCUMENTS

| | | |
|---|---|---|
| JP | 2002-57230 | 2/2002 |
| JP | 2005-79282 | 3/2005 |

OTHER PUBLICATIONS

U.S. Appl. No. 11/396,584, Keisuke Yonehama, et al.
Office Action issued Nov. 30, 2010, in Japanese Patent Application No. 2005-342289 (with English-language Translation).

* cited by examiner

*Primary Examiner* — Ngan Ngo
*Assistant Examiner* — Benjamin Tzu-Hung Liu
(74) *Attorney, Agent, or Firm* — Oblon, Spivak, McClelland, Maier & Neustadt, L.L.P.

(57) ABSTRACT

A memory cell array of a NOR type flash memory is constructed by arranging memory cell transistors in a matrix, each of the memory cell transistors includes a contact connecting a semiconductor substrate to an overlayer wire. Columns of the memory cell transistors are isolated from one another by shallow trench isolations. The height of top surface of a filling oxide film in the shallow trench isolation which is adjacent to each drain contact is equal to that of top surface of the drain region. The top surface of a filling oxide film in the shallow trench isolation which is adjacent to each channel region is higher than a top surface of the semiconductor substrate in the channel region.

21 Claims, 11 Drawing Sheets

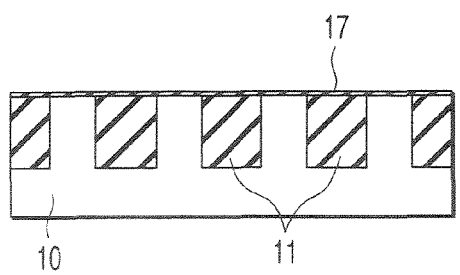
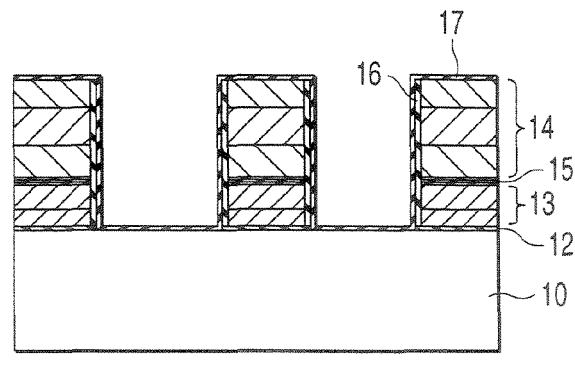
FIG. 10A                FIG. 10B
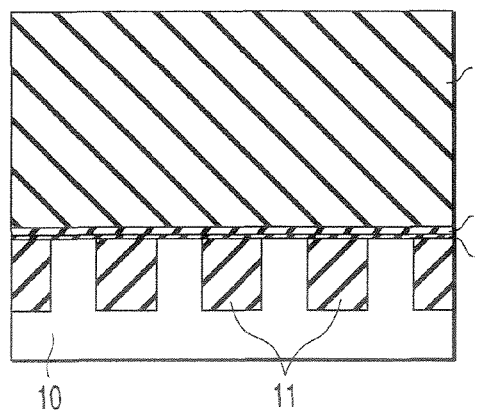
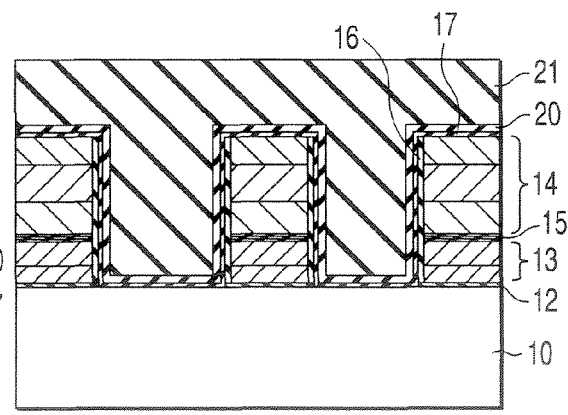
FIG. 11A                FIG. 11B

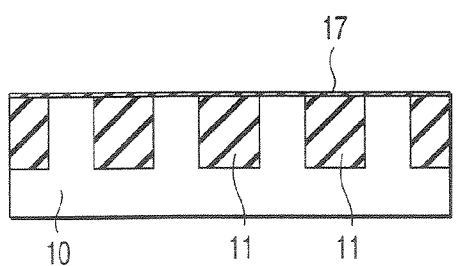
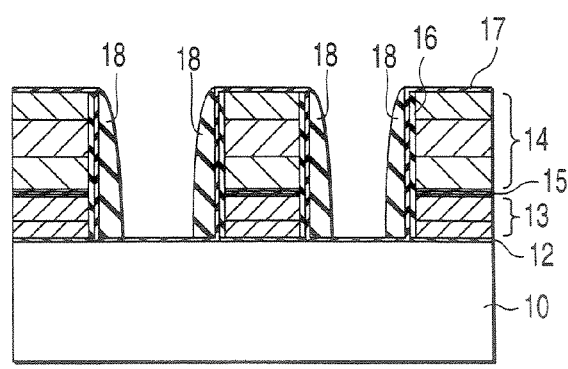
FIG.14A       FIG.14B
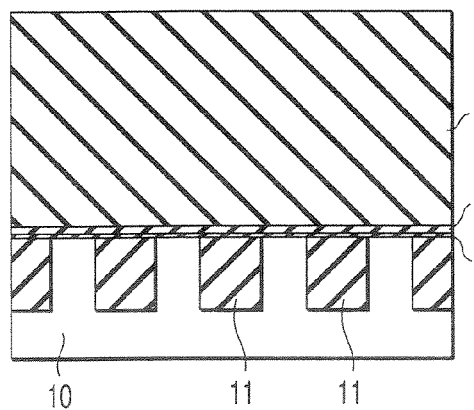
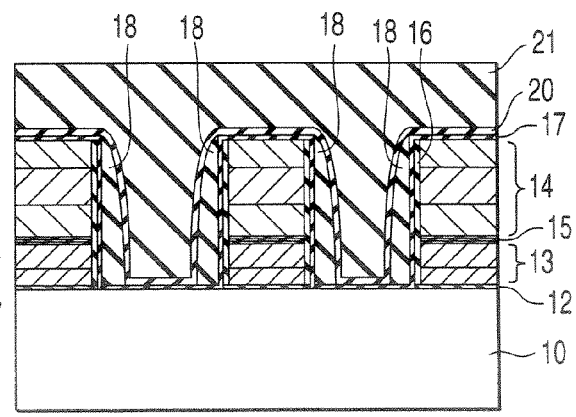
FIG.15A       FIG.15B

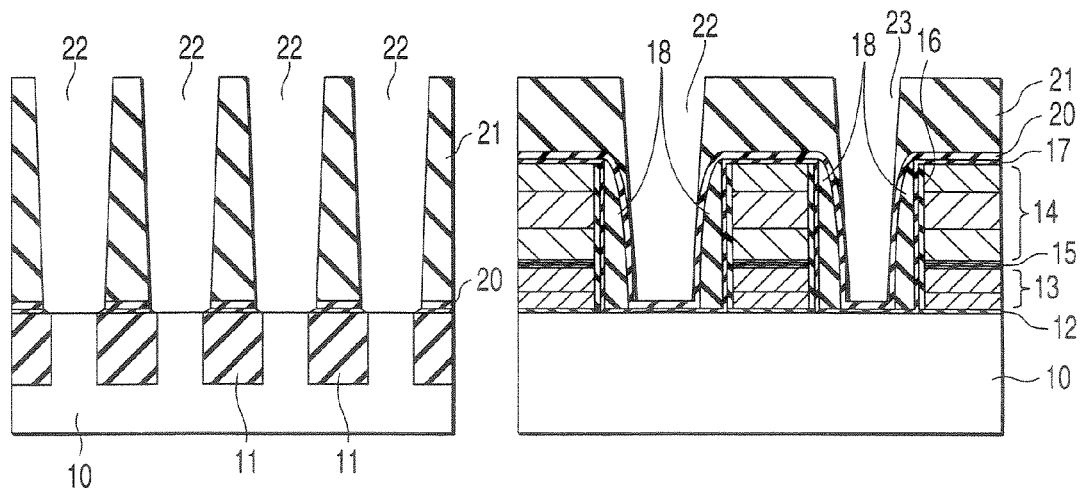
F I G. 16 A   F I G. 16 B
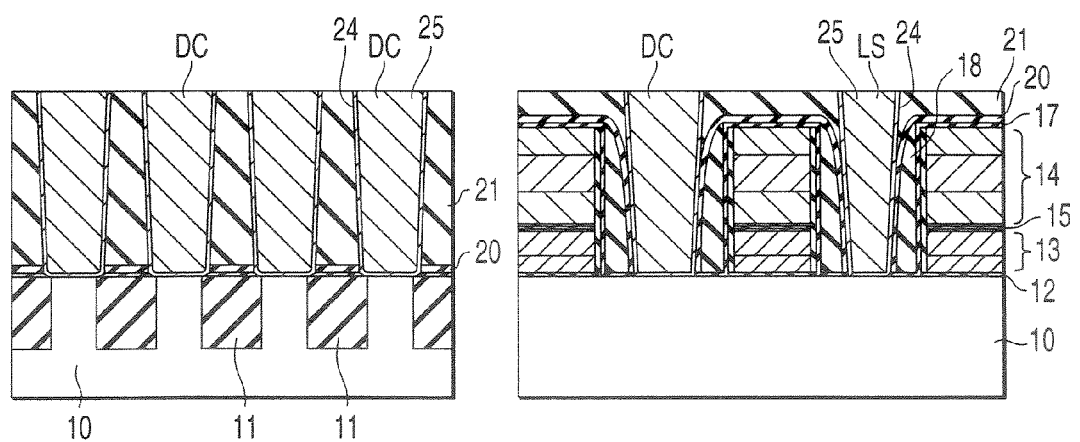
F I G. 17 A   F I G. 17 B

NONVOLATILE SEMICONDUCTOR MEMORY DEVICE AND METHOD FOR MANUFACTURING THE SAME

CROSS-REFERENCE TO RELATED APPLICATIONS

This application is based upon and claims the benefit of priority from prior Japanese Patent Application No. 2005-342289, filed Nov. 28, 2005, the entire contents of which are incorporated herein by reference.

BACKGROUND OF THE INVENTION

1. Field of the Invention

The present invention relates to a nonvolatile semiconductor memory device and a method for manufacturing the nonvolatile semiconductor memory device, and in particular, to the structure of bit line contacts in a memory cell array of a nonvolatile semiconductor memory device and a method for manufacturing the nonvolatile semiconductor memory device. The present invention is used in, for example, NOR type flash memories.

2. Description of the Related Art

A NOR type flash memory has a large number of memory cells each including a nonvolatile transistor having a 2-layer gate structure. The large number of memory cells constitute a memory cell array. A well region is formed in a front layer portion of a silicon substrate. Active regions of the large number of memory cell transistors are arranged in a matrix within the well region. Each of the activate regions includes a source region, a drain region, and a channel region. Two memory transistors adjacent to each other in a column direction share the drain region. Shallow trench isolations (STI) are each formed between rows of memory transistors. The active regions are isolated from one another by STIs. To ensure an insulating distance between the control gate and channel region of the memory cell transistor, the top surface of the active region, which constitutes the channel region, is formed lower than the top surface of a filling oxide film in STI. The top surfaces of the filling materials in STIs each present between columns of memory cell transistors have a uniform height.

Jpn. Pat. Appln. KOKAI Publication No. 2005-79282 discloses a nonvolatile semiconductor memory device in which the top surfaces of the filling materials in STIs have a uniform height. When the top surfaces of the filling materials in STIs have a uniform height, the top surface of the drain region is lower than that of the filling oxide film of STI adjacent to the drain region. This makes it difficult to form a drain contact electrically connected to the drain region, increasing a variation in contact resistance. As a result, the memory cells may operate improperly or their characteristics may be degraded.

BRIEF SUMMARY OF THE INVENTION

According to a first aspect of the present invention, there is provided a nonvolatile semiconductor memory device including a semiconductor substrate on which active regions each having a drain region, a source region, and a channel region and having a top surface are formed; shallow trench isolations each formed of a first insulating film which fills a trench formed around a periphery of the active region on the semiconductor substrate, the first insulating film having a top surface, the shallow trench isolation having a portion adjacent to the drain region; gate electrodes each formed on a corresponding one of the channel regions via a gate insulating film; a second insulating film formed all over the surface of the semiconductor substrate; and drain contacts formed in the second insulating film at positions corresponding to the drain regions and electrically connected to the drain regions, wherein the height of the top surface of the first insulating film in a part of the shallow trench isolation which is adjacent to the drain region is equal to that of the top surface of the drain region.

According to a second aspect of the present invention, there is provided a method for manufacturing a nonvolatile semiconductor memory device, the method including forming a memory cell array on a semiconductor substrate, the memory cell array having a plurality of memory cells arranged in a matrix in a row direction and in a column direction, each of the memory cells having a nonvolatile cell transistor including a source region, a drain region, and a channel region, columns of the plurality of memory cells being insulatively isolated from one another by trench type shallow trench isolations including filling oxide films, etching away the filling oxide films each located adjacent to an area in the memory cell array in which a contact is formed, down to the same height as that of the semiconductor substrate constituting the channel region of the nonvolatile cell transistor, depositing a silicon oxide film and an interlayer insulating film on the memory cell array, removing selected areas of the interlayer insulating film and silicon oxide film to form contact holes, filling conductor layers into the contact holes to form the contacts, and forming at least one layer of metal wire on the interlayer insulating film.

BRIEF DESCRIPTION OF THE SEVERAL VIEWS OF THE DRAWING

FIGS. 10A and 10B are sectional views continued from FIGS. 9A and 9B and showing the process of manufacturing the memory cell array of the NOR type flash memory according to the first embodiment;

FIGS. 11A and 11B are sectional views continued from FIGS. 10A and 10B and showing the process of manufacturing the memory cell array of the NOR type flash memory according to the first embodiment;

FIGS. 14A and 14B are sectional views showing a part of a process of manufacturing the memory cell array of the NOR type flash memory according to the second embodiment;

FIGS. 15A and 15B are sectional views continued from FIGS. 14A and 14B and showing the process of manufacturing the memory cell array of the NOR type flash memory according to the second embodiment;

FIGS. 16A and 16B are sectional views continued from FIGS. 15A and 15B and showing the process of manufacturing the memory cell array of the NOR type flash memory according to the second embodiment; and FIGS. 17A and 17B are sectional views continued from FIGS. 16A and 16B and showing the process of manufacturing the memory cell array of the NOR type flash memory according to the second embodiment.

DETAILED DESCRIPTION OF THE INVENTION

Figure 1:
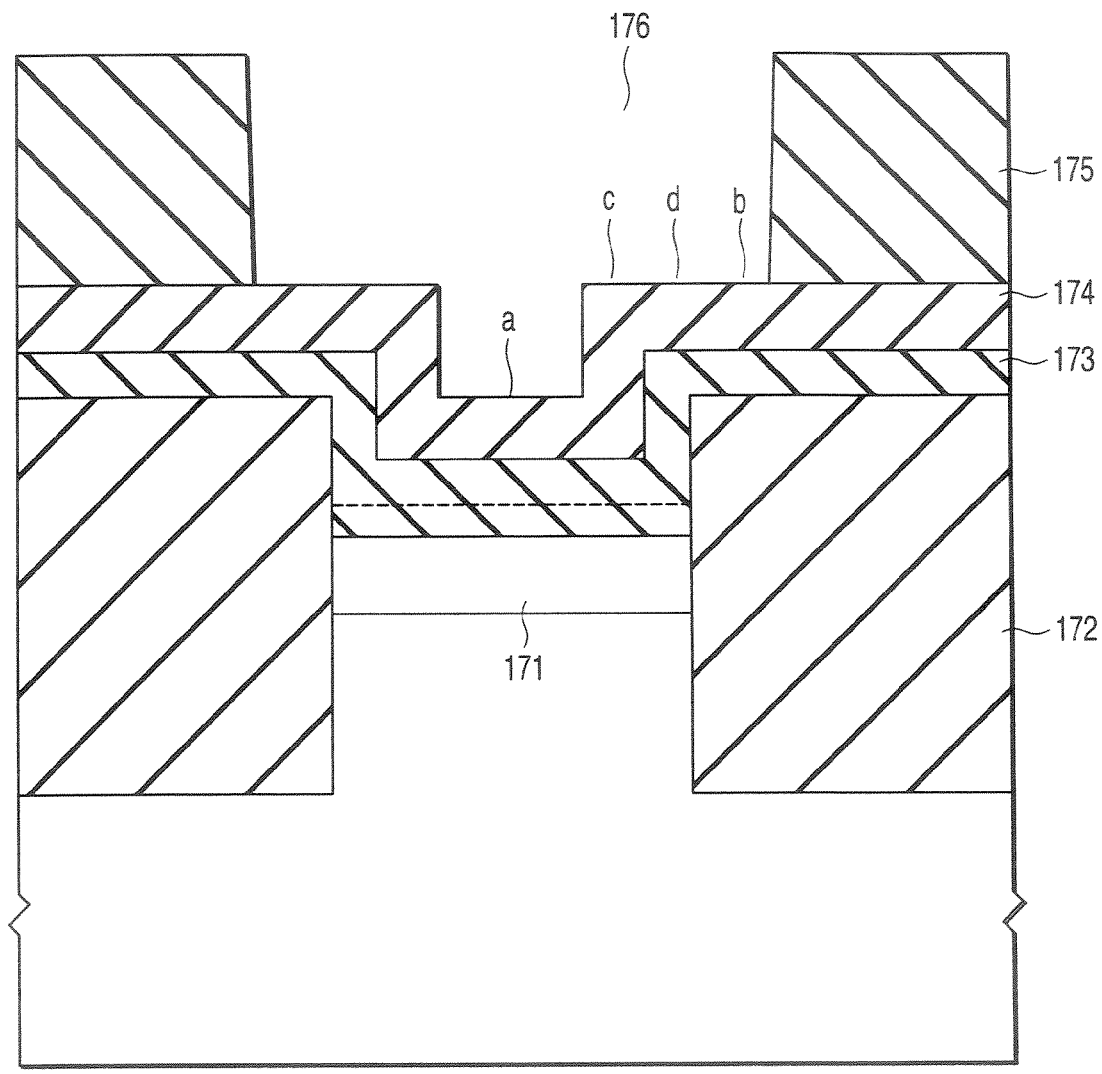
FIG. 1 is a sectional view of a drain contact portion of a common NOR type flash memory.

First, before describing embodiments of the present invention, a comparative example shown in FIG. 1 will be described. The present comparative example is, for example, a nonvolatile semiconductor memory device disclosed in Jpn. Pat. Appln. KOKAI Publication No. 2005-79282. FIG. 1 shows a sectional view showing the vicinity of a drain region of a memory cell transistor cut in a row direction and in which a drain contact has not been formed yet. A drain region 171 is formed in a surface region of a silicon substrate. Filling materials 172 in shallow trench isolations are located on the opposite sides of the drain region. A top surface of the drain region 171 is lower than a top surface of the filling materials 172 in the shallow trench isolations, which are located adjacent to the drain region 171. With this structure, when a silicon oxide film 173 and a silicon nitride film 174 are sequentially deposited all over the surface of the substrate after forming the shallow trench isolations, an underlayer step formed between the drain region 171 and the shallow trench isolations also causes a step to be formed in the silicon oxide film 173 and silicon nitride film 174.

As shown in FIG. 1, at a position a in the vicinity of a central part of the drain region 171, the silicon oxide film 173 is thicker than at a position b on the shallow trench isolation. At a position c in the vicinity of an end of the drain region 171, the nitride film 174 is thicker than at the positions a and b. At a position d closer to the end of the drain region 171, the silicon oxide film 173 is thicker than at the positions a to c. With these variations in the thicknesses of the silicon nitride film 174 and silicon oxide film 173 depending on the position in the vicinity of the drain region, when etching is carried out to form a contact hole 176 in an interlayer insulating film 175 accumulated on the substrate during a later step, the uniformity of etching is degraded. As a result, the above positions c and d, that is, corner portions of the contact hole 176 at its bottom, is rounded, so that contact hole 176 may fail to reach the drain region 171. As the dimensions of an element region and the bottom side of the contact hole 176 decrease owing to a design rule for miniaturization, a drain contact formed so as to fill the contact hole 176 more significantly affects resistance. That is, the drain contact and the drain region 171 may not be properly electrically connected together properly or the contact resistance may vary more greatly.

Now, various embodiments of the present invention will be described. In the description, components shown in all the drawings are denoted by the same reference numerals.

Structure of the First Embodiment

Figure 2:
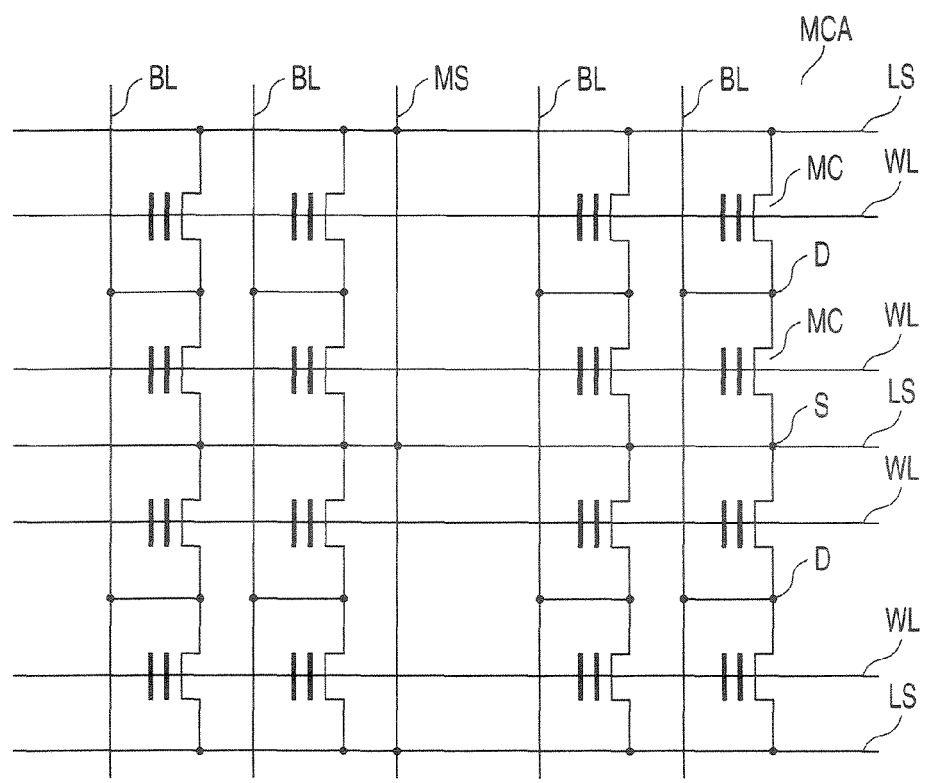
FIG. 2 is a circuit diagram of a memory cell array of a NOR type flash memory according to a first embodiment of the present invention.
Figure 3:
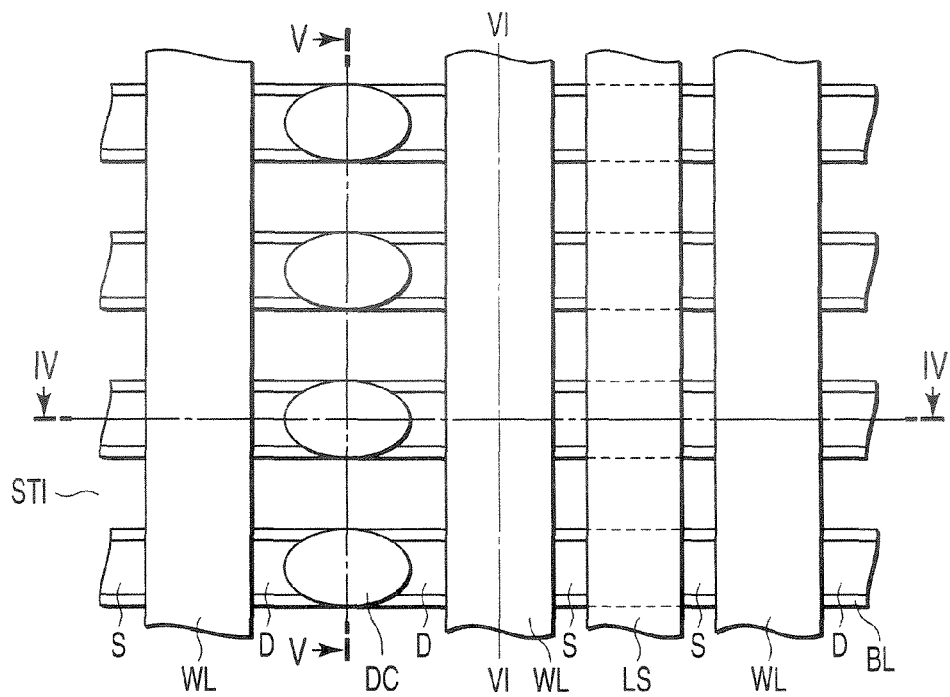
FIG. 3 is a plan view showing a layout of a memory cell array shown in FIG. 2.
Figure 4:
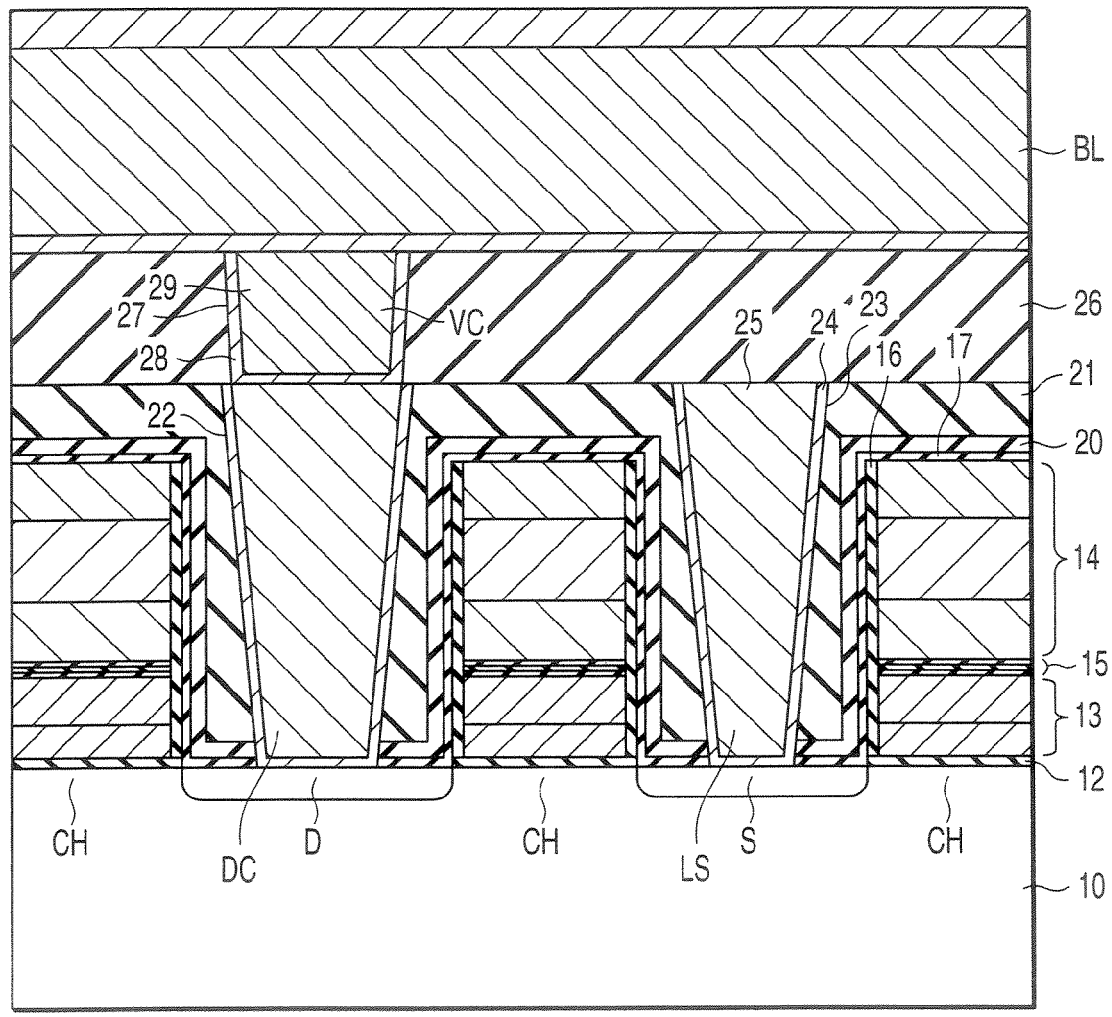
FIG. 4 is a sectional view taken along line IV-IV in FIG. 3.
Figure 5:
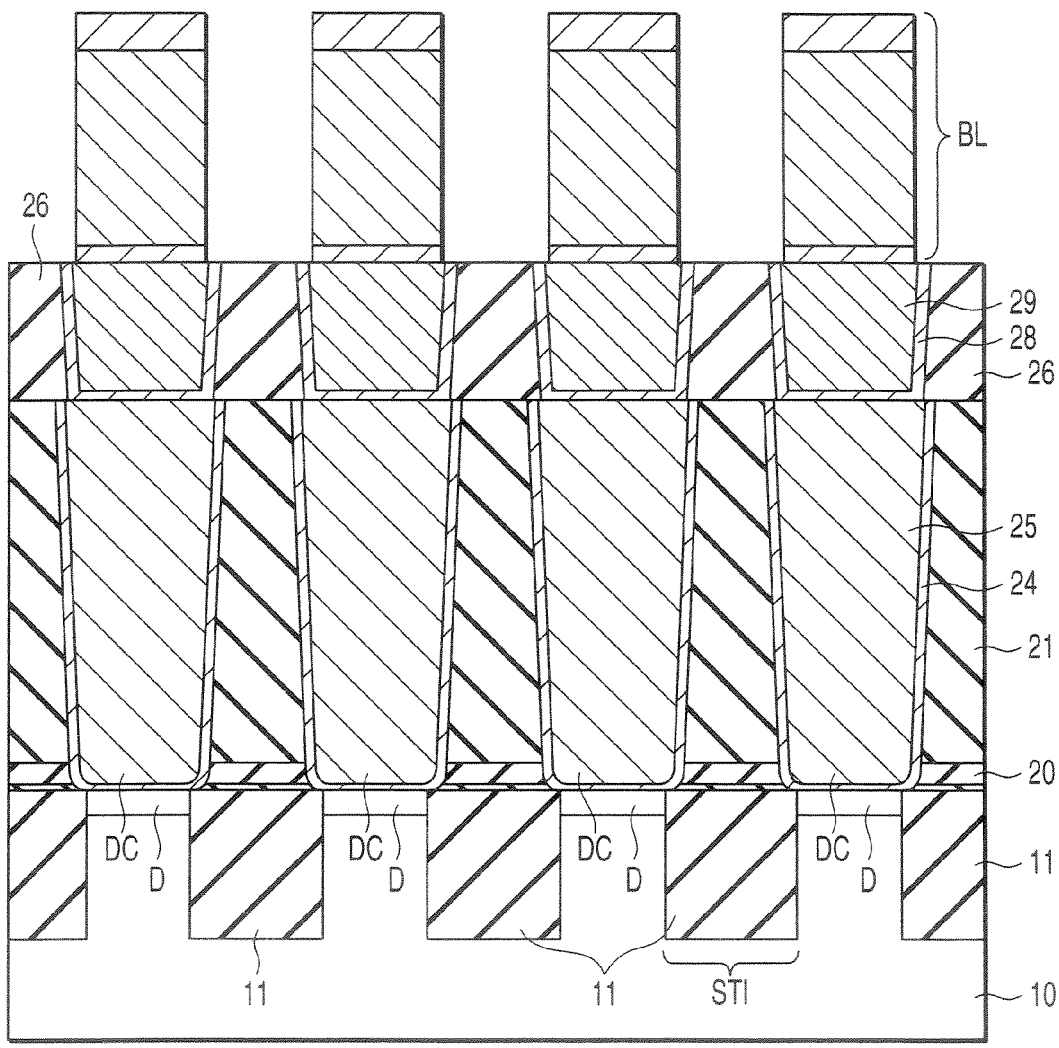
FIG. 5 is a sectional view taken along line V-V in FIG. 3.
Figure 6:
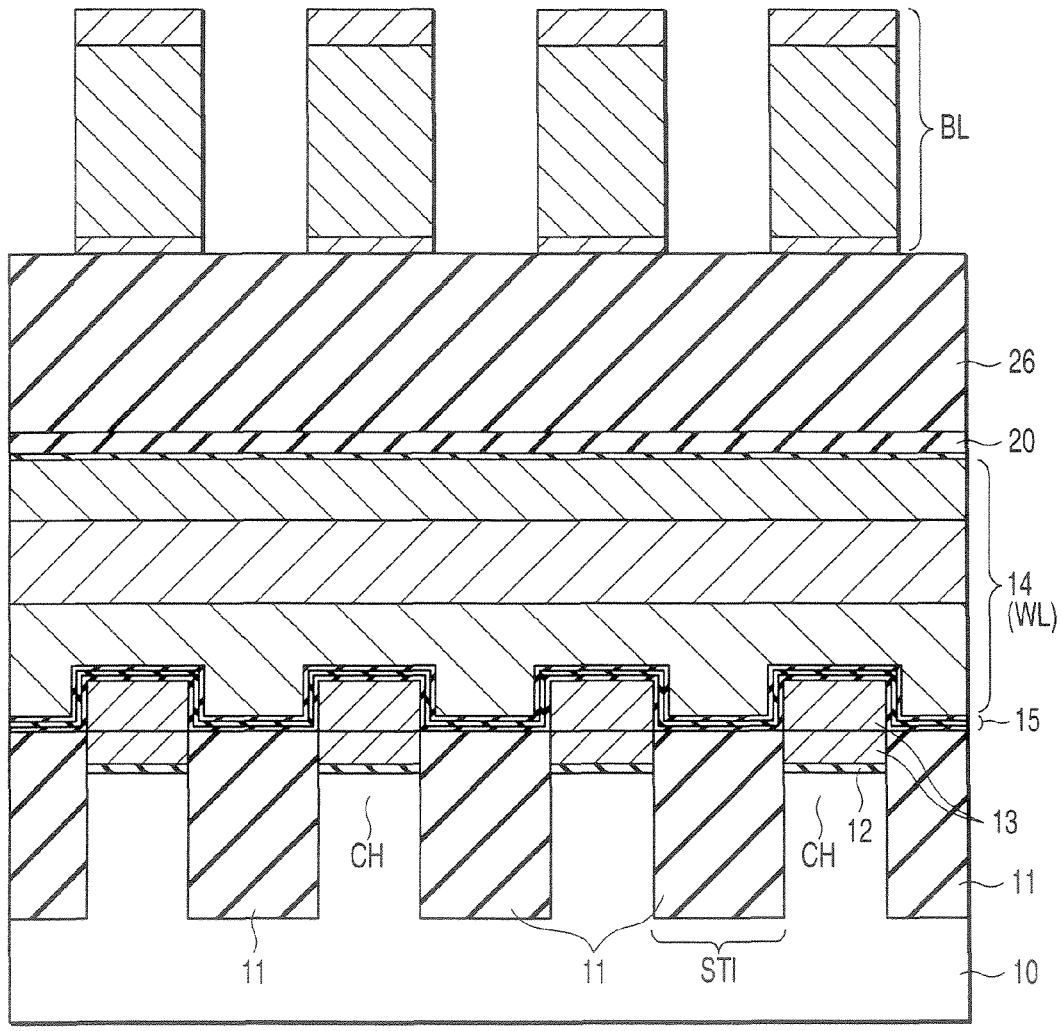
FIG. 6 is a sectional view taken along line VI-VI in FIG. 3.

FIG. 2 shows a circuit diagram of a memory cell array of a NOR type flash memory according to a first embodiment of the present invention. FIG. 3 shows an example of layout of the memory cell array in FIG. 2. FIGS. 4 to 6 show sectional views of different parts of the memory cell array.

As shown in FIG. 2, a plurality of nonvolatile cell transistors MC are arranged in a memory cell array MCA in a row direction and in a column direction; each of the nonvolatile cell transistors MC has a drain region, a source region, and a channel region and has a gate electrode of a 2-layer structure including a floating gate formed on the channel region via a gate insulating film and a control gate formed on the floating gate.

As shown in FIGS. 2 and 3, the following portions are alternately arranged in the column direction of the memory cell array: the portion in which two cell transistors MC are adjacent to each other so as to share a drain region D and the portion in which two other cell transistors MC are adjacent to each other so as to share a source region S. In other words, two cell transistors adjacent to each other in the column direction share the drain region D. Two other cell transistors adjacent to each other in the column direction share the source region S.

A plurality of word lines WL are disposed on the memory cell array in the row direction so that each of the word lines WL is connected to the control gates of all the cell transistors MC on this line. In each column in the memory cell array, each shared drain region D is connected via a drain contact DC to a corresponding one of a plurality of bit lines BL extended in the column direction. In each row in the memory cell array, each shared source region is connected to a corresponding one of a plurality of local source lines LS extended in the row direction. The plurality of local source lines LS are connected to each of a plurality of main source lines MS extended in the column direction as shown in FIG. 2. The plurality of main source lines MS are intermittently disposed among the bit lines BL on the memory cell array.

As shown in FIGS. 4 to 6, a well region 10 is formed in a surface region of a semiconductor substrate (in the present example, a P-type silicon substrate). In the present example, the well region 10 is a P well formed in a surface region of a deep N well. Active regions of the cell transistor MC, that is, an N-type diffusion layer for the source region S and drain region D as well as channel regions CH, are formed on the P well region 10. The source region S and drain region D are each shared by two cell transistors MC adjacent to each other in the column direction as previously described. The active regions are isolated from one another by STIs each formed by filling a filling oxide film 11 into a trench formed around the periphery of the active region. Each cell transistor MC has a gate electrode of a 2-layer gate structure on the channel region CH via a gate insulating film (tunnel oxide film) 12. The gate electrode of the 2-layer gate structure includes a floating gate 13, a control gate 14, and an inter-gate insulating film 15. In the present example, the floating gate 13 has two layers of polysilicon. The inter-gate insulating film 15 is an ONO film, for example. The control gate 14 has a silicide layer formed on a surface of the polysilicon layer. Further, in the present example, a silicon oxide film 16 is formed on a sidewall of the gate electrode of the 2-layer gate structure. A silicon oxide film 17 is formed all over the surface of the gate electrode.

A first interlayer insulating film 21 is formed all over the surface of the semiconductor substrate, including the surface of the gate electrode. A contact hole 22 is formed in the first interlayer insulating film 21 at a position corresponding to each shared drain region D. A trench 23 leading to each shared source region S is formed in the first interlayer insulating film 21 at a position corresponding to the shared source region S so as to extend in the column direction. The drain contact DC is formed so as to fill each of the contact holes 22. The drain contact DC is electrically connected to the shared drain region D. The local source line LS is formed so as to fill each of the trenches 23. The local source line LS is electrically connected to the shared source region S. The drain contact DC and local source line LS includes a barrier metal 24 and a metal 25, respectively; the metal 25 is formed on the barrier metal 24.

A second interlayer insulating film 26 is formed all over the surface including the surfaces of the drain contact DC and local source line LS. A via hole 27 is formed in the interlayer insulating film 26 at a position corresponding to each drain contact DC. A via contact VC is formed so as to fill each of the via holes 27. The via contact VC is electrically connected to the drain contact DC. The via contact VC includes a barrier metal 28 and a metal 29 formed on the barrier metal 28.

A bit line BL is formed on the interlayer insulating film 26. The bit line BL is electrically connected to the shared drain region D via the via contact VC and drain contact DC.

In the present embodiment, as shown in FIG. 5, the height of top surface of the filling oxide film 11 in the shallow trench isolation which is adjacent to the drain region D under the drain contact DC is set equal to that of top surface of the drain region D of the cell transistor. Further, as shown in FIG. 6, the height of top surface of the filling oxide film 11 in the shallow trench isolation which is adjacent to the channel region CH is set higher than that of top surface of the channel region CH. This allows the entire bottom surface of the drain contact DC to contact the drain region D.

When using channel hot electron injection to inject electrons into the floating gate 13 in order to write data to the cell transistor MC, the NOR type flash memory configured as described above provides a ground potential to the source region S and well region 10 of the cell transistor MC. The control gate 14 and drain region D are provided with a desired potential from an external circuit via the corresponding word line WL and bit line BL, respectively, so as to maximize the efficiency with which hot electrons are generated.

In the structure of memory cell array of the NOR type flash memory according to the first embodiment, the top surface of the filling oxide film 11 in the shallow trench isolation which is adjacent to the drain region has the same height as that of top surface of the drain region D. This allows the entire substrate surface of the drain region D to contact the bottom surface portion of the drain contact DC.

The lack of a step between the shallow trench isolation STI in the drain contact DC and the element region in the memory cell array prevents improper electric connection between the drain contact DC and the drain region D owing to the shape of bottom side of the drain contact DC as well as a variation in contact resistance. This makes it possible to avoid the improper operation of the memory cell transistor MC and the degradation of its characteristics.

Structure of the Second Embodiment

Figure 7:
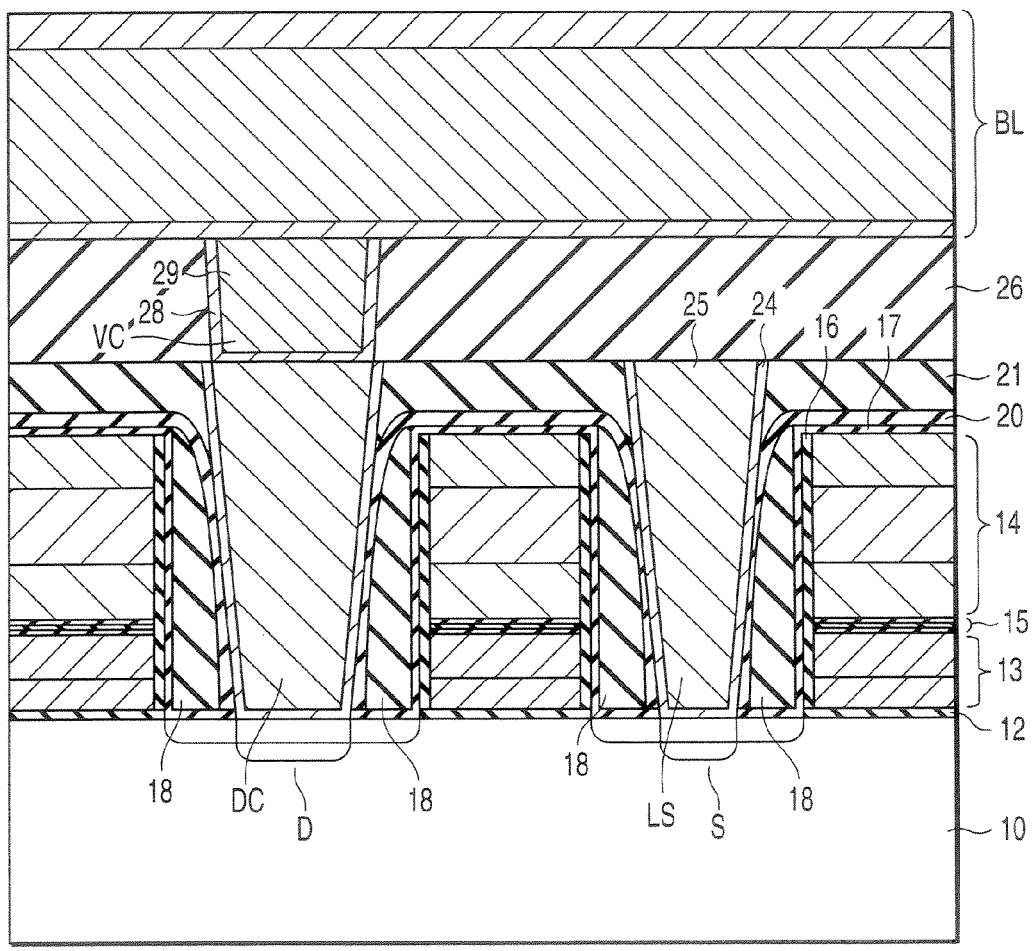
FIG. 7 is a sectional view of a NOR type flash memory according to a second embodiment of the present invention.
Figure 8:
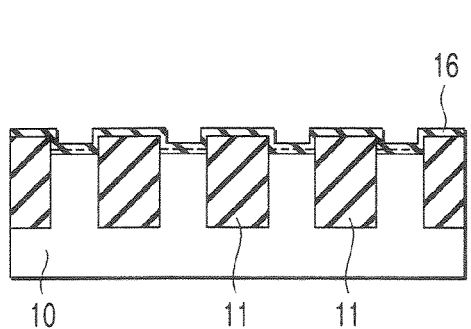
FIGS. 8A and 8B are sectional views showing a part of a process of manufacturing the memory cell array of the NOR type flash memory according to the first embodiment.
Figure 8:
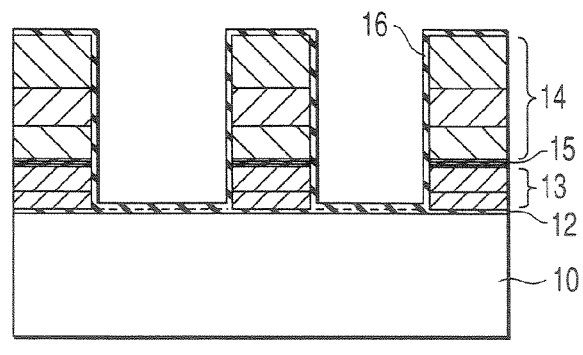
Figure 9:
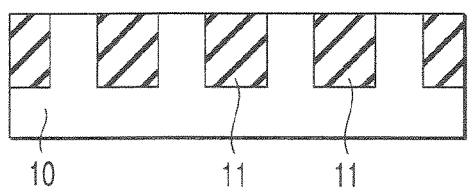
FIGS. 9A and 9B are sectional views continued from FIGS. 8A and 8B and showing the process of manufacturing the memory cell array of the NOR type flash memory according to the first embodiment.
Figure 9:
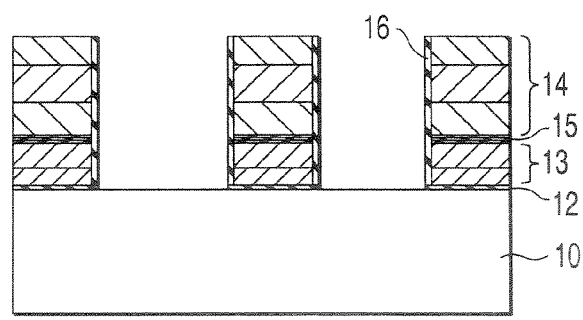
Figure 12:
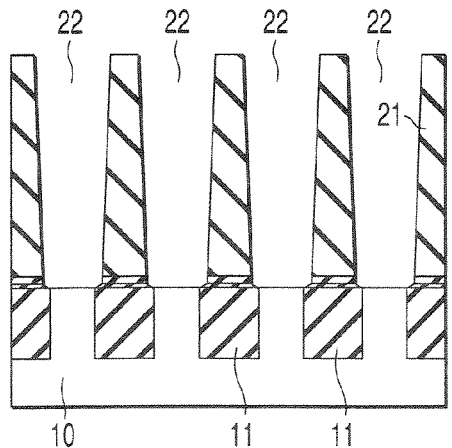
FIGS. 12A and 12B are sectional views continued from FIGS. 11A and 11B and showing the process of manufacturing the memory cell array of the NOR type flash memory according to the first embodiment.
Figure 12:
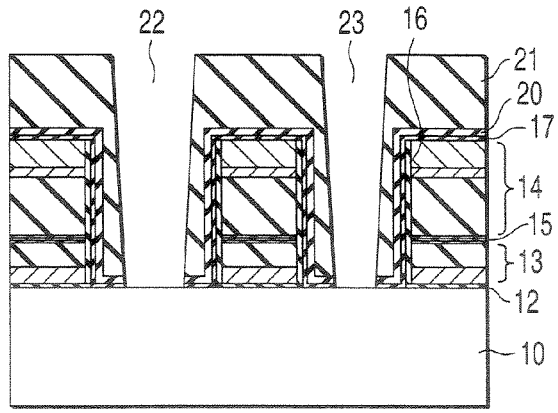
Figure 13:
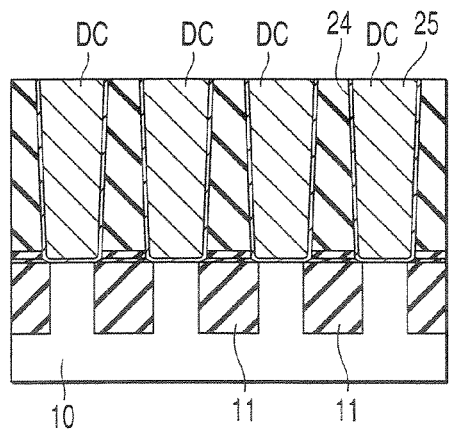
FIGS. 13A and 13B are sectional views continued from FIGS. 12A and 12B and showing the process of manufacturing the memory cell array of the NOR type flash memory according to the first embodiment.
Figure 13:
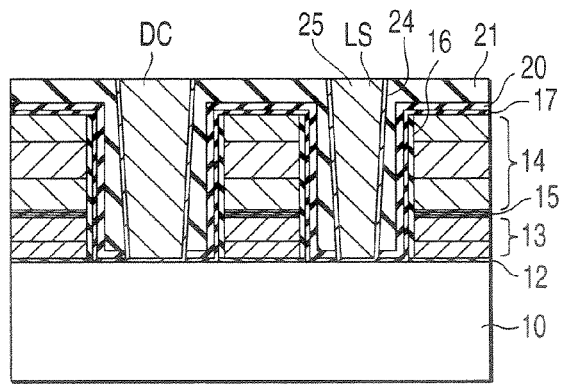

FIG. 7 shows a sectional view of a memory cell array of a NOR type flash memory according to a second embodiment of the present invention. The sectional view in FIG. 7 corresponds to the sectional view in FIG. 4, showing the NOR type flash memory according to the first embodiment. The other arrangements are similar to those of the first embodiment and their illustration is thus omitted.

The NOR type flash memory according to the second embodiment, shown in FIG. 7, differs from that according to the first embodiment in that a spacer 18 including a silicon nitride film is formed on a side wall of gate electrode of the cell transistor. The silicon oxide films 16 and 17 are formed on each gate electrode as is the case with FIG. 4, with the spacer 18 formed outside the silicon oxide films 16 and 17.

This structure is suitable for forming a transistor of what is called an LDD (Lightly Doped Drain) structure in which the drain region includes a diffusion region of a low impurity concentration and a diffusion region of a high impurity concentration which has a larger diffusion depth and a smaller area than the diffusion region of the low impurity concentration. Owing to the high breakdown voltage characteristic of transistors of the LDD structure, the LDD structure is adopted for transistors in a peripheral circuit which require a higher breakdown voltage. In this case, the cell transistors in the memory cell array can be formed during the same process as that in which the high breakdown voltage transistors in the peripheral circuit are formed.

Manufacturing Method According to the First Embodiment

Now, with reference to FIGS. 8A and 8B to 13A and 13B, a method for manufacturing a NOR type flash memory according to the first embodiment will be described focusing on the memory cell array. In FIGS. 8A and 8B to 13A and 13B, each FIG. A corresponds to a VI-VI section in FIG. 3. Each FIG. B corresponds to an IV-IV section in FIG. 3. The illustration of formation of the drain region D and source region S is omitted.

First, as shown in FIGS. 8A and 8B, trenches for shallow trench isolations are formed in the well region 10 on the silicon substrate. Filling oxide films 11 are deposited in the respective trenches. Then, a gate electrode of a 2-layer structure is formed which includes the gate insulating film 12, the floating gate 13, the control gate 14, and the gate insulating film 15. A silicon oxide film 16 is a TEOS film or the like is further deposited.

Then, as shown in FIGS. 9A and 9B, anisotropic etching is carried out so that the top surface of the filling oxide film 11 in each shallow trench isolation has the same height as that of top surface of the silicon substrate. At this time, the silicon oxide film 16 on the gate electrode is removed.

Then, as shown in FIGS. 10A and 10B, a silicon oxide film 17 which is one or both of a TEOS film and a thermal oxide film is deposited. Further, as shown in FIGS. 11A and 11B, a silicon nitride film 20 and a first interlayer insulating film 21 are deposited. The first interlayer insulating film 21 is then flattened by a CMP process. In the element region, the silicon oxide film 17, silicon nitride film 20, and first interlayer insulating film 21 are thus deposited on the silicon substrate.

Subsequently, as shown in FIGS. 12A and 12B, the first interlayer insulating film 21, silicon nitride film 20, and silicon oxide film 17 are processed using a lithography technique and anisotropic etching, to form drain contact holes 22 and filling source line trenches 23. Then, as shown in FIGS. 13A and 13B, barrier metals 24 and metals 25 including, for example, W and which are a filling material for contacts, are deposited in the contact holes 22 and trenches 23. The barrier metals 24 and metals 25 are then flattened by the CMP process to form drain contacts DC and local source lines LS.

Subsequently, as shown in FIGS. 4 to 6, a second interlayer insulating film 26 is deposited and flattened by the CMP process. Then, the second interlayer insulating film 26 is processed using the lithography technique and anisotropic etching, to form via holes 27 on the drain contacts DC and via holes on the local source lines LS. Barrier metals 28 and metals 29 are then deposited in the via holes and flattened by the CMP process to form via contacts VC on the drain contacts DC and via contacts (not shown) on the local source lines LS. A metal film is then deposited and patterned to form bit lines BL and master source lines MS (not shown).

Manufacturing Method According to the Second Embodiment

Now, a method for manufacturing a NOR type flash memory according to the second embodiment will be described. A process for manufacturing a NOR type flash memory according to the second embodiment is basically similar to that according to the first embodiment but has an additional step of forming a spacer 18 on the sidewall of the gate electrode of the cell transistor.

Now, with reference to FIGS. 14A and 14B to 17A and 17B, a method for manufacturing a NOR type flash memory according to the second embodiment will be described focusing on the memory cell array. In FIGS. 14A and 14B to 17A and 17B, each FIG. A corresponds to a VI-VI section in FIG. 3. Each FIG. B corresponds to an IV-IV section in FIG. 3. The illustration of formation of the drain region D and source region S is omitted.

First, in the method for manufacturing a NOR type flash memory according to the first embodiment, the steps described above with reference to FIGS. 8A and 8B to 10A and 10B are performed. Then, as shown in FIGS. 14A and 14B, a silicon nitride film is deposited and anisotropically etched to form a spacer 18 on a side of each gate electrode. The spacer 18 is formed during the step of forming the LDD structure of each transistor element in the peripheral circuit portion that drives the cell transistors.

The subsequent steps are performed in the same manner as those described above with reference to FIGS. 11A and 11B to 13A and 13B. That is, as shown in FIGS. 15A and 15B, a silicon nitride film 20 and a first interlayer insulating film 21 are deposited, and the first interlayer insulating film 21 is flattened by the CMP process. In the element region, the silicon oxide film 17, silicon nitride film 20, and first interlayer insulating film 21 are thus deposited on the silicon substrate. Subsequently, as shown in FIGS. 16A and 16B, the first interlayer insulating film 21, silicon nitride film 20, and silicon oxide film 17 are processed using the lithography technique and anisotropic etching, to form drain contact holes 22 and filling source line trenches 23.

Then, as shown in FIGS. 17A and 17B, barrier metals 24 and metals 25 including, for example, W and which are a filling material for contacts, are deposited in the contact holes 22 and trenches 23. The barrier metals 24 and metals 25 are then flattened by the CMP process to form drain contacts DC and local source lines LS.

Subsequently, as shown in FIGS. 4 to 6, a second interlayer insulating film 26 is deposited and flattened by the CMP process. Then, the second interlayer insulating film 26 is processed using the lithography technique and anisotropic etching, to form via holes 27 on the drain contacts DC and via holes on the local source lines LS. Barrier metals 28 and metals 29 are then deposited in the via holes and flattened by the CMP process to form via contacts VC on the drain contacts DC and via contacts (not shown) on the local source lines LS. A metal film is then deposited and patterned to form bit lines BL and master source lines MS (not shown).

Structure of a Modification of the First and Second Embodiments

In the description of the first and second embodiments, the local source lines LS are formed on the source region S. However, instead of the local source lines LS, source contacts may be formed on the source region S. In other words, the present invention is applicable to the case where source contacts are formed as is the case with the arrangement of the drain contacts DC, shown in FIG. 3. That is, as in the case of the drain contacts DC, shown in FIG. 5, the height of top surface of the filling oxide film 11 in the shallow trench isolation which is adjacent to the source region S under the source contact is set equal to that of top surface of the source region S. Further, as shown in the sectional view in FIG. 6, the height of top surface of the filling oxide film 11 in the shallow trench isolation which is adjacent to the channel region CH of the cell transistor MC is set equal to that of top surface of the channel region CH. This produces effects similar to those of the first and second embodiments.

Structure of a Third Embodiment

The above description of the first and second embodiments and their modification relates to the memory cell array of the NOR type flash memory having the 1-transistor structure. However, the present invention can be implemented in a memory cell array of a NOR type flash memory having a 2-transistor structure in which each memory cell includes a nonvolatile cell transistor and a select gate transistor.

That is, the memory cell array of the NOR type flash memory having the 2-transistor structure according to the third embodiment has memory cell units arranged in a matrix and each formed so that nonvolatile cell transistors each having a gate electrode of a 2-layer gate structure share a source region and so that select gate transistors share a drain region. In this case, two rows of memory cell units having shared drain regions and two rows of memory cell units having shared source regions are alternately arranged; in the shared drain region, cell transistors adjacent to each other in the column direction share the drain region, and in the shared source region, select gate transistors adjacent to each other in the column direction share the source region.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
    a semiconductor substrate on which active regions each including a drain region, a source region, and a channel region and having a top surface are formed;
    shallow trench isolations each formed of a first insulating film which fills a trench formed around a periphery of the active region in the semiconductor substrate, the first insulating film having a top surface, the shallow trench isolation having a portion adjacent to the drain region;
    gate electrodes each formed on a corresponding one of the channel regions via a gate insulating film;
    a second insulating film formed all over the surface of the semiconductor substrate; and
    drain contacts formed in the second insulating film at positions corresponding to the drain regions and electrically connected to the drain regions;
    wherein the height of the top surface of the first insulating film in a part of the shallow trench isolation which is adjacent to the drain region is equal to that of the top surface of the drain region to which the drain contact is connected, and the height of the top surface of the first insulating film in a part of the shallow trench isolation which is adjacent to the channel region is set greater than the height of the top surface of the first insulating film in the part of the shallow trench isolation which is adjacent to the drain region.

2. The device according to claim 1, wherein each of the gate electrodes is a gate structure of a 2-layer structure including a control gate and a floating gate.

3. The device according to claim 1, wherein the shallow trench isolation has the portion adjacent to the channel region, and the top surface of the first insulating film of the portion of the shallow trench isolation which is adjacent to the channel region is set higher than the surface of the channel region.

4. The device according to claim 1, wherein the drain contact includes:
a barrier metal; and
a metal formed on the barrier metal.

5. The device according to claim 1, further comprising:
source lines formed in the second insulating film at positions corresponding to the source regions and electrically connected to the source regions.

6. The device according to claim 5, wherein the source line includes:
a barrier metal; and
a metal formed on the barrier metal.

7. The device according to claim 1, further comprising:
spacers each formed on a side wall of a corresponding one of the gate electrodes.

8. The device according to claim 7, wherein the spacer includes a silicon nitride film.

9. The device according to claim 1, wherein the height of the bottom surface of each of the drain contacts is equal to that of the top surface of the shallow trench isolation which is adjacent to the drain region.

10. The device according to claim 1, wherein the bottom surface of each of the drain contacts, contacts the top surfaces of both of the shallow trench isolations that are adjacent to the drain region.

11. A nonvolatile semiconductor memory device comprising:
a NOR type memory cell array having a plurality of nonvolatile cell transistors arranged in a row direction and in a column direction and each having a drain region, a source region, and a channel region in a well region formed in a surface region of a semiconductor substrate, each nonvolatile cell transistor having a gate electrode of a 2-layer structure including a floating gate formed on the channel area via a gate insulating film and a control gate formed on the floating gate via an inter-gate insulating film, two nonvolatile memory cells adjacent to each other in the column direction sharing the drain region;
shallow trench isolation regions formed in the semiconductor substrate to isolate the columns of the plurality of nonvolatile memory cells from one another, each of the shallow trench isolation regions including a filling material having a top surface;
a first insulating film formed on the entire surface of the semiconductor substrate; and
drain contacts formed in the first insulating film at positions corresponding to the drain regions and electrically connected to the drain regions;
wherein the height of the top surface of the filling material in a portion of the shallow trench isolation region which is adjacent to the drain region is equal to that of a surface of the drain region to which the drain contact is connected, and the height of the top surface of the filling material in a part of the shallow trench isolation which is adjacent to the channel region is set greater than the height of the top surface of the filling material in the part of the shallow trench isolation which is adjacent to the drain region.

12. The device according to claim 11, wherein the memory cell array is arranged that two nonvolatile memory cells different from the two nonvolatile memory cells adjacent to each other in the column direction share the source region and that the shared drain regions and the shared source regions alternate in the column direction.

13. The device according to claim 11, wherein the drain contact includes:
a barrier metal; and
a metal formed on the barrier metal.

14. The device according to claim 11, further comprising:
source lines formed in the first insulating film at positions corresponding to the source regions and electrically connected to the source regions.

15. The device according to claim 14, wherein the source line includes:
a barrier metal; and
a metal formed on the barrier metal.

16. The device according to claim 11, further comprising:
a second insulating film formed on the entire surface including the surfaces of the drain contacts;
via contacts formed in the second insulating film at positions corresponding to the drain contacts and electrically connected to the drain contacts; and
bit lines formed on the second insulating film and electrically connected to the via contacts.

17. The device according to claim 11, further comprising:
spacers each formed on a side wall of a corresponding one of the gate electrodes.

18. The device according to claim 17, wherein the spacer includes a silicon nitride film.

19. The device according to claim 11, wherein the height of the bottom surface of each of the drain contacts is equal to that of the top surface of the shallow trench isolation region that is adjacent to the drain region.

20. The device according to claim 11, wherein the bottom surface of each of the drain contacts, contacts the top surfaces of both of the shallow trench isolation regions that are adjacent to the drain region.

21. The device according to claim 11, wherein the shallow trench isolation has the portion adjacent to the channel region, and the top surface of the filling material of the portion of the shallow trench isolation which is adjacent to the channel region is set higher than the top surface of the channel region.

* * * * *